United States Patent [19]

Fujimura et al.

[11] Patent Number: 5,523,643
[45] Date of Patent: Jun. 4, 1996

[54] ULTRASONIC PIEZOELECTRIC TRANSDUCER AND ULTRASONIC ACTUATOR

[75] Inventors: Takanao Fujimura, Kodaira; Tomoki Funakubo, Hachiohji; Yougo Imai, Hachiohji; Toshiharu Tsubata, Hachiohji; Yoshihisa Taniguchi, Hachiohji; Takashi Ouchi, Hachiohji; Hiroyuki Imabayashi, Sagamihara; Yukihiko Sawada, Tokorozawa; Katsuhiro Wakabayashi, Hachiohji, all of Japan

[73] Assignee: Olympus Optical Company Limited, Japan

[21] Appl. No.: 480,885

[22] Filed: Jun. 7, 1995

Related U.S. Application Data

[63] Continuation of Ser. No. 97,715, Jul. 27, 1993, abandoned.

[30] Foreign Application Priority Data

Aug. 18, 1992 [JP] Japan ................... 4-241301

[51] Int. Cl.⁶ .................. H02N 2/00; H01L 41/08
[52] U.S. Cl. .................................................. 310/328
[58] Field of Search ............................... 310/328

[56] References Cited

U.S. PATENT DOCUMENTS

| | | | |
|---|---|---|---|
| 4,651,046 | 3/1987 | Ohya et al. | 310/328 |
| 4,780,639 | 10/1988 | Shirasu | 310/328 |
| 4,947,077 | 8/1990 | Murata | 310/328 |
| 5,079,471 | 1/1992 | Nygren | 310/328 |
| 5,159,226 | 10/1992 | Montgomery | 310/333 |

FOREIGN PATENT DOCUMENTS

| | | | |
|---|---|---|---|
| 0265573 | 11/1988 | Japan | 310/328 |
| 0119577 | 5/1990 | Japan | 310/328 |

*Primary Examiner*—Thomas M. Dougherty
*Attorney, Agent, or Firm*—Ostrolenk, Faber, Gerb & Soffen

[57] ABSTRACT

An ultrasonic piezoelectric transducer and an ultrasonic actuator for performing enhanced elliptical vibration comprise a first laminated piezoelectric element having a first fixed end, a resonator mounted to the opposite end of the first laminated piezoelectric element, a second laminated piezoelectric element having one end thereof fixedly mounted to the resonator in a direction other than a vibrating direction of the first laminated piezoelectric element, and a load mass fixedly mounted to the opposite end of the second laminated piezoelectric element. This structure permits the enhanced elliptical vibration of the transducer to have a large, controllable amplitude.

26 Claims, 11 Drawing Sheets

F I G. 10
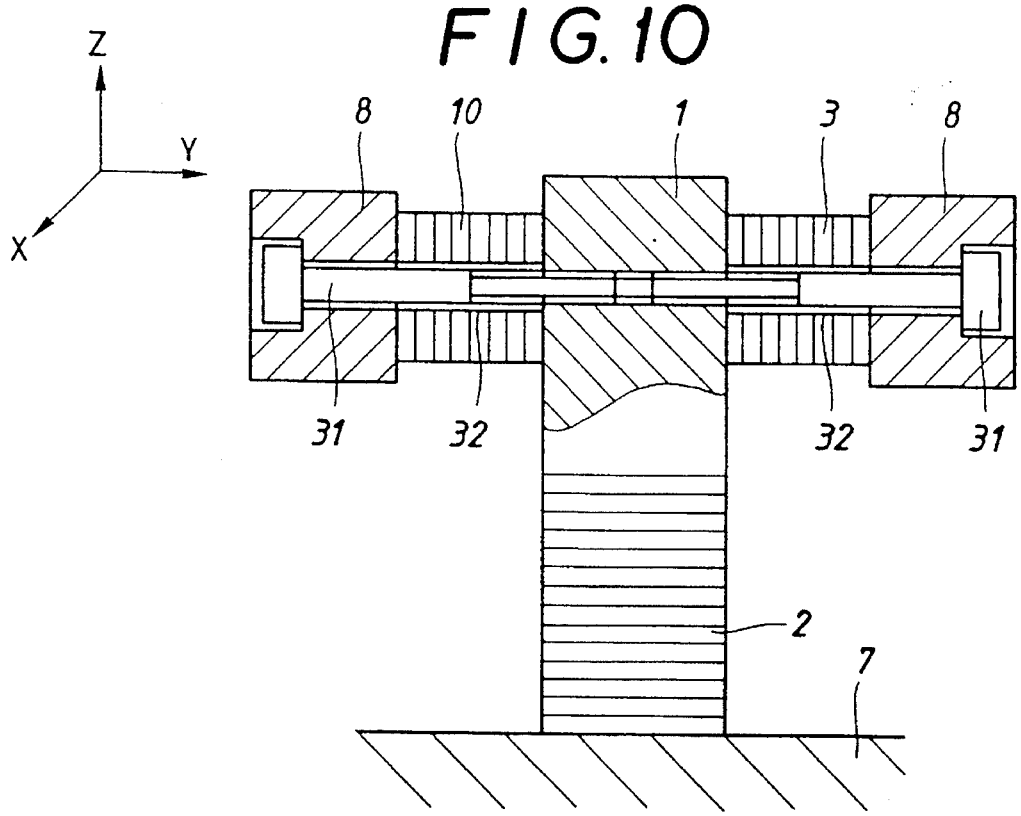
F I G. 12
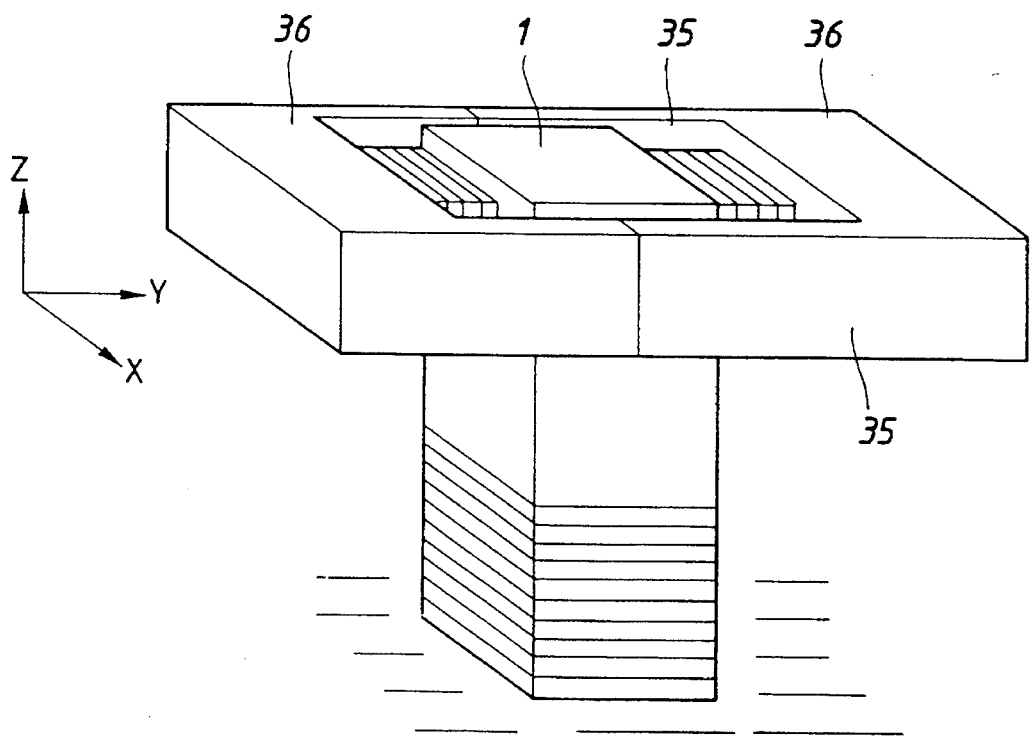

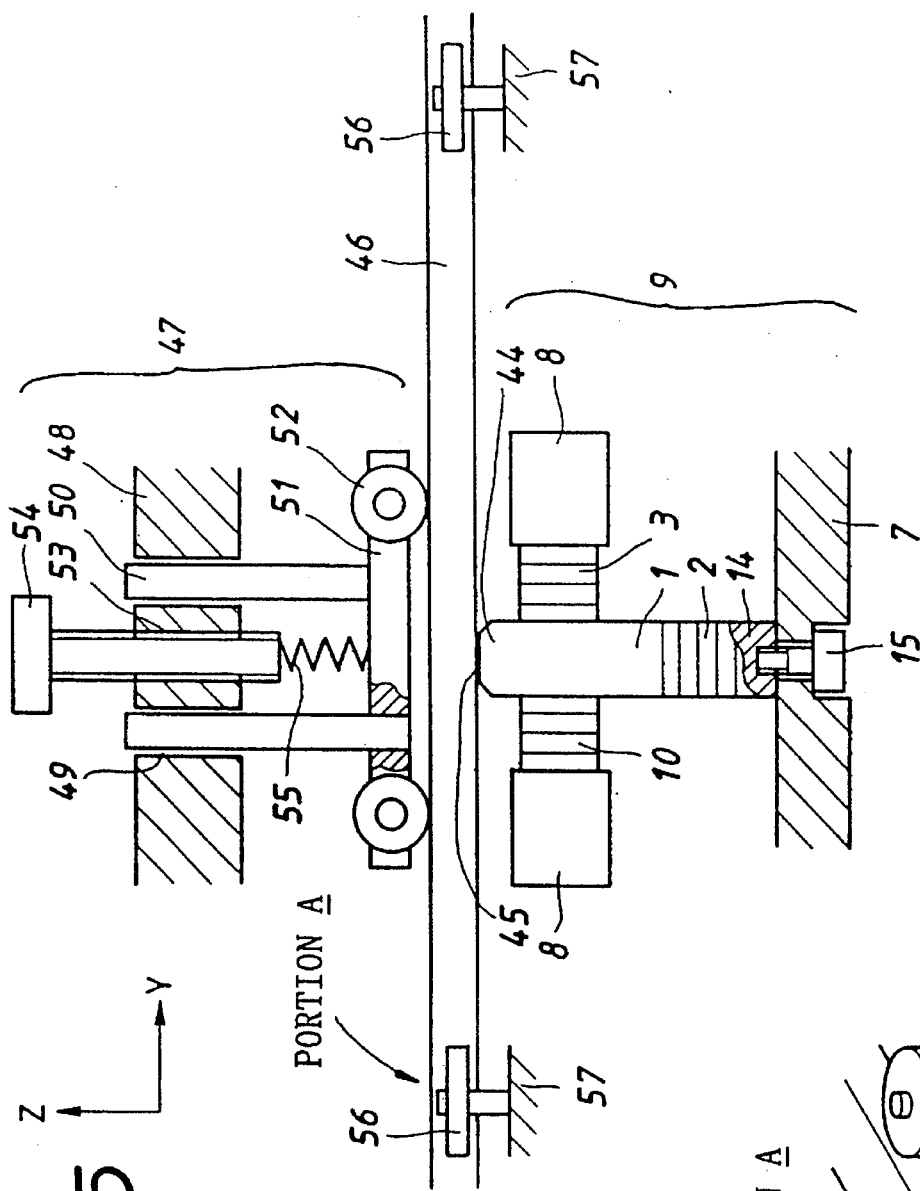
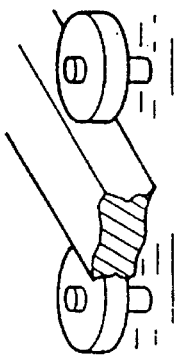

ULTRASONIC PIEZOELECTRIC TRANSDUCER AND ULTRASONIC ACTUATOR

This is a Continuation of application Ser. No. 08/097,715 filed on Jul. 27, 1993 now abandoned.

BACKGROUND OF THE INVENTION (1) Field of the Invention

The present invention relates generally to an ultrasonic piezoelectric transducer, and more particularly, to an ultrasonic piezoelectric transducer and an ultrasonic actuator which generate ultrasonic oscillation or vibration by utilizing an electro-mechanical energy conversion element such as a piezoelectric element, an electric distortion element or the like.

(2) Related Art Statement

The conventional ultrasonic piezoelectric transducer of the kind referred to above, for example, has been disclosed in Japanese Patent Laid-Open No. 7875/1990. The piezoelectric transducer comprises a piezoelectric laminated body in which an upper table for transmitting an oscillation or vibration output is provided at one end surface of a piezoelectric laminated member comprising a plurality of plate-like piezoelectric elements stacked upon each other. A lower table serving as a substrate is provided at the other end surface of the piezoelectric transducer, and a pair of piezoelectric elements are provided on opposing side surfaces of the piezoelectric laminated body. Means for controlling synthesis or composition of vibration generated by the piezoelectric laminated body and vibration generated by the pair of piezoelectric elements to vibrate the upper table in a desired direction are provided. Specifically, as shown in FIG. 17 of the attached drawings, the ultrasonic piezoelectric transducer is arranged such that a laminated piezoelectric element 2 comprising plurality of stacked piezoelectric elements is fixedly mounted on an upper surface of a resonator 1, and piezoelectric elements 3a and 3b of bimorph type are adhered to and fixedly mounted respectively on opposing side surfaces of the resonator 1. An upper base 4 is fixedly mounted on an upper surface of the laminated piezoelectric element 2, and a projection 5 is provided on the upper base 4. When the ultrasonic piezoelectric transducer is activated, alternating voltages shifted in phase 90 degrees from each other are applied to the laminated piezoelectric element 2 and the piezoelectric elements 3a and 3b. Vibration components in a longitudinal direction and in a lateral direction are composed with each other, and a composing condition is controlled, to cause the projection 5 to undergo elliptic vibration or inclined reciprocal vibration in which a material point on the piezoelectric transducer has an optional magnitude and an optional mode or aspect.

However, the conventional ultrasonic piezoelectric transducer discussed above has a problem, in that it is difficult to sufficiently obtain an appreciable amplitude in a Y-direction (in a bending or curving direction) upon resonance. This is due to the fact that, since the piezoelectric elements 3a and 3b of the bimorph structure are used in driving in the Y-direction, it is impossible to reduce the thickness T of the resonator as far as possible in view of the structure thereof. For this reason, the rigidity of the resonator per se is raised or increases, so that there cannot be a sufficient bending motion.

OBJECTS AND SUMMARY OF THE INVENTION

In view of the above-discussed deficiencies of the prior art, it is an object of the present invention to provide an ultrasonic piezoelectric transducer and an ultrasonic actuator which are simple in structure, which overcomes the drawbacks of the conventional device, which are small in size, and which provide a large amplitude output.

In order to achieve the above-described object, an ultrasonic piezoelectric transducer according to the invention is so arranged as to comprise a first laminated piezoelectric element having one end thereof which is fixedly supported, a resonator fixedly mounted on the other end of the first laminated piezoelectric element, a second laminated piezoelectric element having one end thereof which is fixedly mounted on the resonator in a direction other than a vibrating direction of the first laminated piezoelectric element, the other surfaces of the resonator being unobstructed, and an additional mass fixedly mounted on the other end of the second laminated piezoelectric element.

Another ultrasonic piezoelectric transducer according to the invention comprises a first laminated piezoelectric element having one end thereof fixedly supported, a resonator fixedly mounted on the other end of the first laminated piezoelectric element, second laminated piezoelectric elements forming a laterally symmetric pair, each having one end thereof fixedly mounted on the resonator in a direction other than a vibrating direction of the first laminated piezoelectric element, the other sides of the resonator being unobstructed, and additional masses fixedly mounted respectively on the opposite ends of the respective second laminated piezoelectric elements.

Further, another ultrasonic piezoelectric transducer according to the invention comprises a first laminated piezoelectric element having a first end thereof fixedly supported, a resonator having a rectangular square pole shape or configuration fixedly mounted on the other end of the first laminated piezoelectric element, second laminated piezoelectric elements each having one end thereof fixedly mounted on four respective side surfaces of the resonator in a direction other than a vibrating direction of the first laminated piezoelectric element, the other sides of the resonator being unobstructed, and additional masses fixedly mounted respectively on opposite ends of the respective second laminated piezoelectric elements.

In the aforesaid ultrasonic piezoelectric transducer, the arrangement may be such that the first end of the first laminated piezoelectric element is fixedly supported through a retaining element, and the retaining element is provided with a constriction to facilitate bending motion thereof.

Moreover, another ultrasonic piezoelectric transducer according to the invention is provided which comprises a resonator having one end thereof fixedly supported, a first laminated piezoelectric element fixedly mounted on the other end of the resonator, a second laminated piezoelectric element having one end thereof fixedly mounted on the resonator in a direction other than a vibrating direction of the first laminated piezoelectric element, and an additional mass fixedly mounted on the other end of the second laminated piezoelectric element.

Furthermore, another ultrasonic piezoelectric transducer according to the invention comprises a resonator having at one end thereof being an elastic portion and fixedly mounted through the elastic portion, a first laminated piezoelectric element fixedly mounted on the other end of the resonator, second laminated piezoelectric elements forming a laterally symmetric pairs, each having a respective end thereof fixedly mounted on the resonator in a direction other than a vibrating direction of the first laminated piezoelectric element, and retaining elements for fixing the other ends of the respective second laminated piezoelectric elements.

In the ultrasonic piezoelectric transducer according to the invention arranged as described above, non-resonating longitudinal vibration due to the first laminated piezoelectric element and bending resonant vibration due to the second laminated piezoelectric elements and the additional masses are composed with each other to excite elliptic vibration on a forward end of the piezoelectric transducer. Here, the additional masses so act as to amplify the bending resonant vibration.

If the second laminated piezoelectric elements and the additional masses are provided in a pair by left- and right-hand symmetry, it is possible to prevent unnecessary vibration due to non-symmetry from being generated.

Further, if the second laminated piezoelectric elements and the additional masses are mounted respectively on each one the four side surfaces of the resonator, composed elliptic vibration is directed toward an optional direction.

If the first end of the first laminated piezoelectric element is fixedly supported to a base through a retaining element, and if a constriction is provided on the retaining element, a bending stress applied to the first laminated piezoelectric element by bending vibration is reduced.

Moreover, even if the first laminated piezoelectric element is mounted on an upper surface of the resonator which performs bending vibration by the second laminated piezoelectric elements, it is possible to prevent a bending stress from being applied to the first laminated piezoelectric element.

Furthermore, if an elastic portion is formed on the resonator, it is possible to prevent a bending stress from being applied to the first and second laminated piezoelectric elements.

As described above, according to the ultrasonic piezoelectric transducer and the ultrasonic actuator of the invention, since the bending vibration is performed by the laminated piezoelectric element, it is made possible to magnify or enlarge the amplitude of the bending resonance vibration. Thus, it is possible to provide the ultrasonic piezoelectric transducer and the ultrasonic actuator which are large in amplitude output, although the ultrasonic piezoelectric transducer and the ultrasonic actuator are simple in structure and are small in size.

The other features and advantages of the present invention will become apparent enough with the following explanation.

BRIEF DESCRIPTION OF THE DRAWINGS

FIG. 10 is a partially broken-away front elevational view showing an ultrasonic piezoelectric transducer according to a ninth embodiment of the invention;

FIG. 12 is a perspective view showing a modification of the ultrasonic piezoelectric transducer according to the ninth embodiment of the invention;

FIGS. 15 and 15A are front elevational views showing an ultrasonic actuator according to a twelfth embodiment of the invention;

DETAILED DESCRIPTION OF THE PREFERRED EMBODIMENTS

Figure 1:
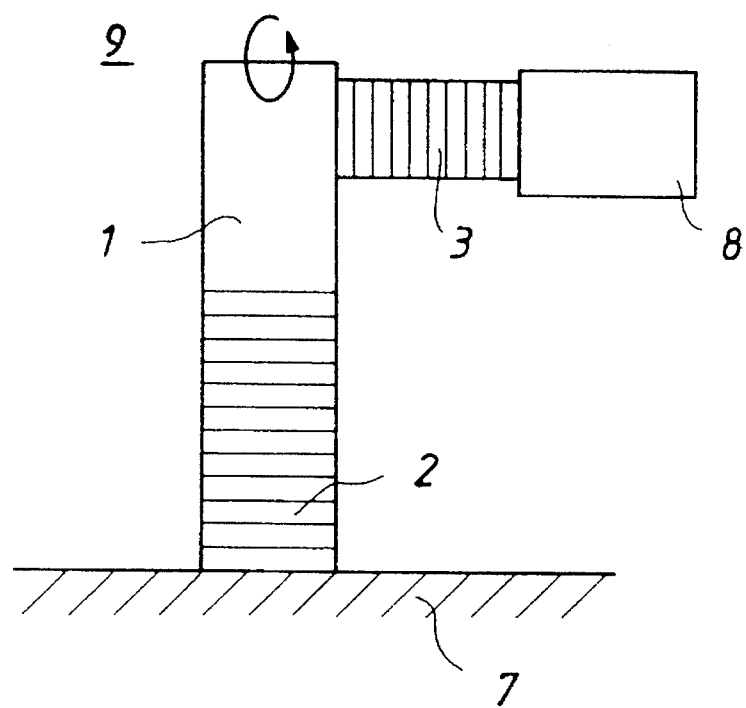
FIG. 1 is a front elevational view showing an ultrasonic piezoelectric transducer according to a first embodiment of the invention.

Various embodiments of an ultrasonic piezoelectric transducer and an ultrasonic actuator according to the invention will hereafter be described with reference to the accompanying drawings. In this connection, the same reference numerals are applied to the same components and parts in the description with reference to the drawings, and any duplicate description will be omitted.

[FIRST EMBODIMENT]

A first embodiment of the invention will first be described. FIG. 1 is a front elevational view showing an ultrasonic piezoelectric transducer according to a first embodiment of the invention. In FIG. 1, the reference numeral 1 denotes a resonator which comprises a metallic material formed into a square pole configuration; and 2 and 3 denote laminated piezoelectric elements in which a plurality of plate-like piezoelectric elements are laminated upon each other. The first laminated piezoelectric element 2 is provided such that a bottom surface thereof is adhered to and fixedly mounted on a base 7, and the resonator 1 is adhered to and fixedly mounted on an upper surface of the first laminated piezoelectric element 2. The second laminated piezoelectric element 3 has one end thereof which is adhered to and fixedly mounted on a side surface of the resonator 1. An additional mass 8 is fixedly mounted on the other end of the second laminated piezoelectric element 3. Here, for the material of the resonator 1, aluminum, duraluminum, stainless steel and brass are adequate which are superior in vibration characteristics. On the other hand, for the additional mass 8, a material high in specific gravity is preferable in order to obtain optical mass effects, and a metal such as iron, copper, lead, stainless steel, brass or the like, or various dense ceramics are adequate.

Figure 2:
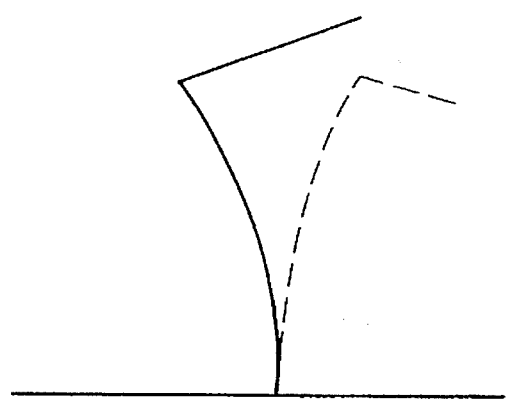
FIG. 2 is a view for explanation of bending vibration of the ultrasonic piezoelectric transducer according to the first embodiment.

Next, upon activation, sinusoidal-wave or sinewave alternating voltages which are shifted in phase from each other by 90 degrees are applied to the laminated piezoelectric elements 2 and 3. Then, a forward end of the ultrasonic piezoelectric transducer 9 is vibrated vertically by non-resonant vertical vibration due to the first laminated piezoelectric element 2 and, simultaneously, is vibrated horizontally by bending resonant vibration due to the second laminated piezoelectric element 3. The ultrasonic piezoelectric transducer 9 performs elliptical motion due to the combined effect of these vibrations. Here, if the frequency of the driving alternating current is coincident with the bending resonant frequency of the ultrasonic piezoelectric transducer 9 which is excited by the second laminated piezoelectric element 3, the additional mass 8 mounted on the laminated piezoelectric element 3 serves to amplify the bending resonant vibration so that it is possible to vibrate the entire piezoelectric transducer which a large amplitude to the left and right, as shown in FIG. 2. In this connection, in order to invert the rotational direction of the elliptical motion, the phase of the alternating current applied to the first laminated piezoelectric element 2 should be inverted by 180 degrees.

According to the present embodiment, since the bending vibration is exited by the laminated piezoelectric element 3, there can be produced a large amplitude as compared with a conventional piezoelectric element of the bimorph type. It is possible to amplify the bending resonant vibration by utilizing the additional mass 8 which is mounted on the laminated piezoelectric element 3.

[SECOND EMBODIMENT]

Figure 3:
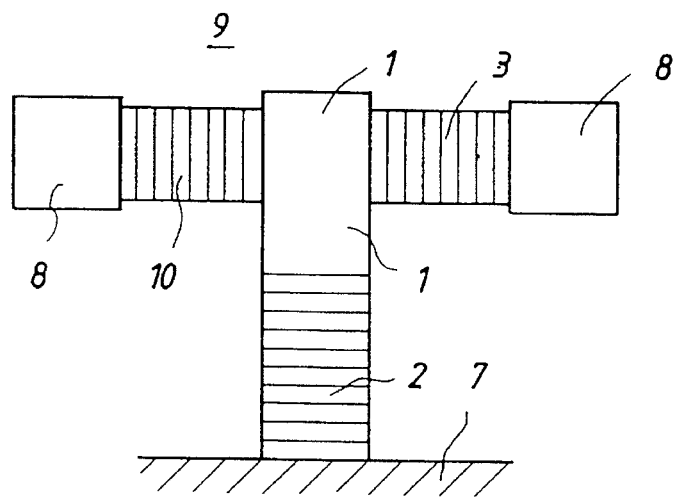
FIGS. 3(a), 3(b) and 3(c) are front elevational views showing an ultrasonic piezoelectric transducer according to a second embodiment of the invention.
Figure 3:
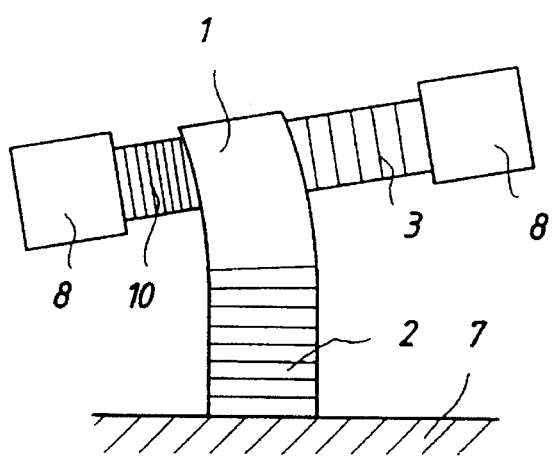
Figure 3:
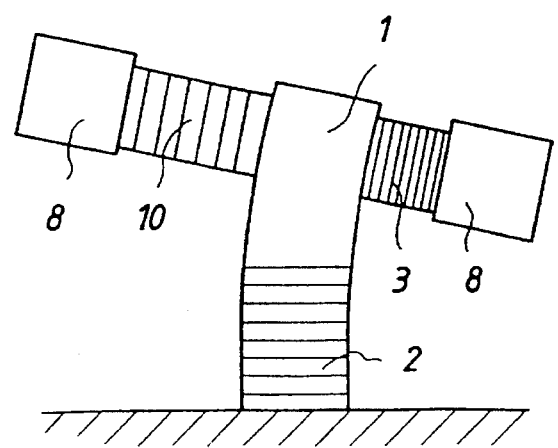

A second embodiment of the invention will now be described. FIGS. 3(a), 3(b) and 3(c) are front elevational views showing an ultrasonic piezoelectric transducer according to the second embodiment of the invention. The present embodiment is arranged such that second laminated piezoelectric elements 3 and 10 forming a pair by left- and right-hand symmetry are mounted on a resonator 1. That is, the second embodiment is of a structure in which the laminated piezoelectric element 10 and a pair of additional masses 8 are laterally symmetrically mounted on the first embodiment. Upon activation sinusoidal-wave alternating voltages shifted in phase 180 degrees from each other are applied respectively to the laminated piezoelectric element 3 and the laminated piezoelectric element 10. Then, the laminated piezoelectric element 10 is contracted when the laminated piezoelectric element 3 is extended or expanded (FIG. 3(b)). Conversely, the laminated piezoelectric element 10 is extended when the laminated piezoelectric element 3 is contracted (FIG. 3(c)). Similarly to the first embodiment, if a sinusoidal-wave alternating voltage shifted in phase 90 degrees from the voltage applied laminated piezoelectric element 3 is applied to the laminated piezoelectric element 2, a forward end of an ultrasonic piezoelectric transducer 9 is vibrated vertically by non-resonance vibration due to the first laminated piezoelectric element 2 and, simultaneously, is vibrated horizontally by bending resonant vibration due to the second laminated piezoelectric elements 3 and 10. The forward end of the ultrasonic piezoelectric transducer 9 performs elliptic motion due to the composition of these vibrations.

According to the present embodiment, since the second laminated piezoelectric elements and the additional masses are provided in a symmetrical pair, the piezoelectric transducers are arranged in left- and right-hand symmetry so that it is possible to restrain generation of unnecessary vibration due to asymmetry of the configuration. Further, since the bending vibration force becomes twice the value as that of the first embodiment, it is possible to obtain larger amplitude.

[THIRD EMBODIMENT]

Figure 4:
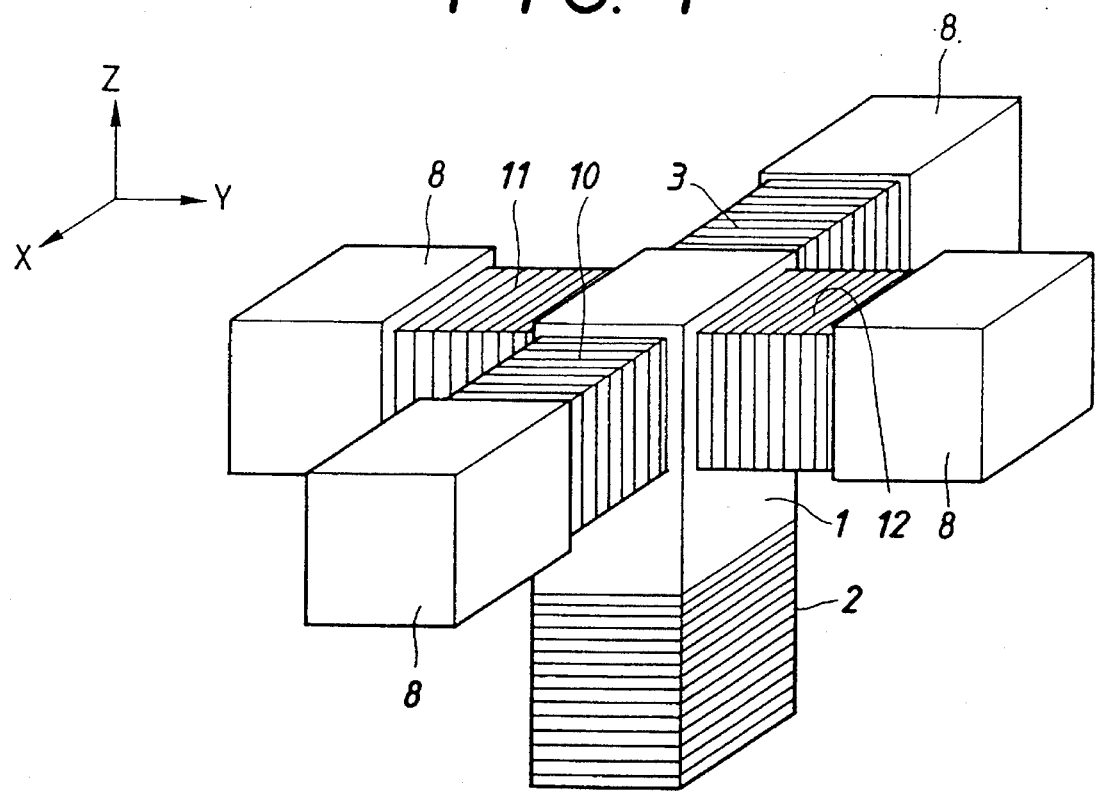
FIG. 4 is a perspective view showing an ultrasonic piezoelectric transducer according to a third embodiment of the invention.

Next, a third embodiment of the invention will now be described. FIG. 4 is a perspective view showing an ultrasonic piezoelectric transducer according to the third embodiment of the invention. The present embodiment is arranged such that second laminated piezoelectric elements 3, 10, 11 and 12 are mounted respectively on four side surfaces of a resonator 1 having a square pole configuration. Additional masses 8 are adhered to and fixedly mounted respectively to the opposite ends of the respective laminated piezoelectric elements.

In the present embodiment, vertical vibration of the laminated piezoelectric element 2 in a Z-axis direction and bending vibration due to the laminated piezoelectric elements 3 and 10 in an X-axis direction combine with each other to excite elliptic vibration in an X–Z plane. Further, similarly, by a combination of the laminated piezoelectric element 2 and the laminated piezoelectric elements 11 and 12, elliptic vibration in a Y–Z plane is excited. If the drive voltage and phase of the laminated piezoelectric elements 3 and 10 and the laminated piezoelectric elements 11 and 12 are properly regulated, it is possible to excite elliptic vibration in an optional direction.

[FOURTH EMBODIMENT]

Figure 5:
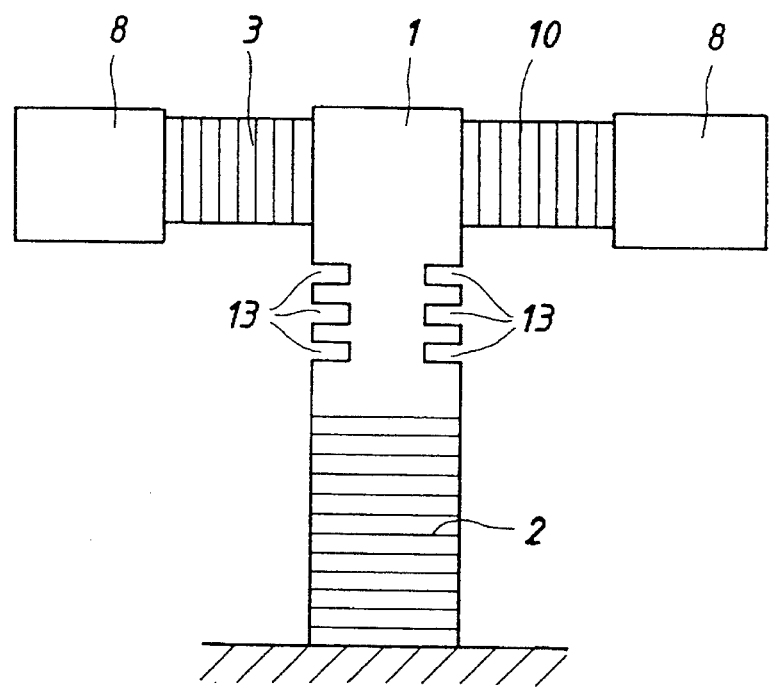
FIG. 5 is a front elevational view showing an ultrasonic piezoelectric transducer according to a fourth embodiment of the invention.

Next, a fourth embodiment of the invention will be described. FIG. 5 is a front elevational view showing an ultrasonic piezoelectric transducer according to the fourth embodiment of the invention. In the present embodiment, a plurality of grooves 13 are formed in side surfaces of a resonator 1 having a square pole configuration. By doing so, bending rigidity of the resonator 1 in a bending vibrating direction is reduced so that it is possible to reduce the bending stress applied to the laminated piezoelectric element 2. In this connection, in a case where second laminated piezoelectric elements are adhered respectively to four side surfaces of the resonator 1 as is in the third embodiment, the grooves 13 may also be formed in the four side surfaces.

[FIFTH EMBODIMENT]

Figure 6:
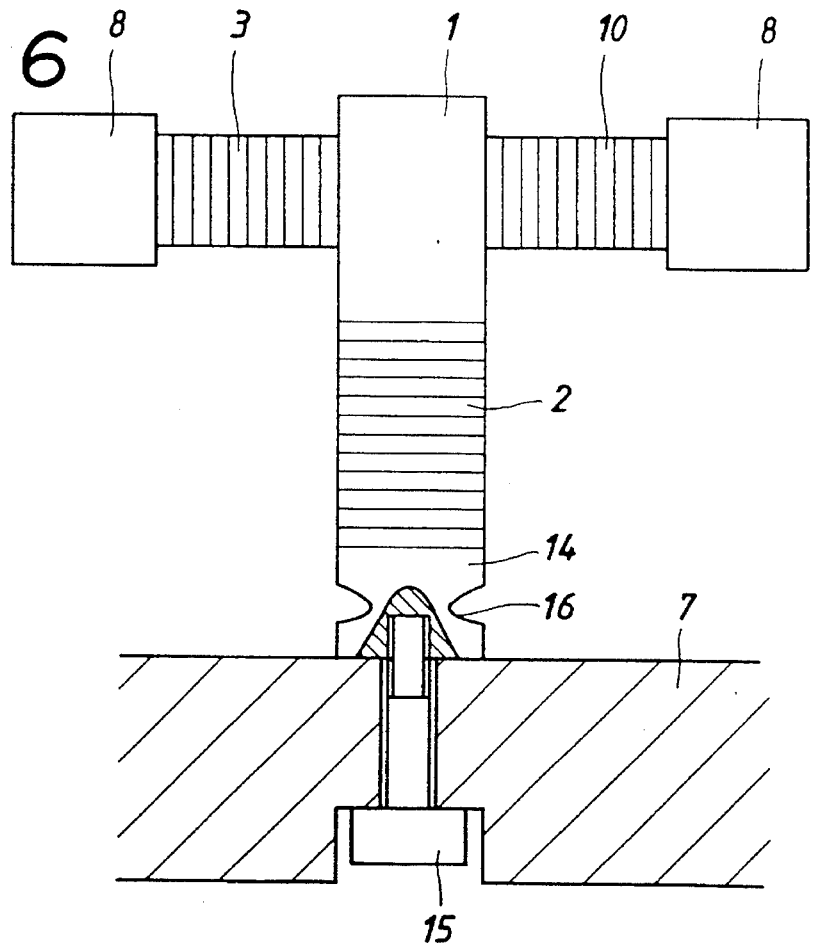
FIG. 6 is a partially broken-away front elevational view showing an ultrasonic piezoelectric transducer according to a fifth embodiment of the invention.

Next, a fifth embodiment of the invention will be described. FIG. 6 is a front elevational view showing, partially broken away, an ultrasonic piezoelectric transducer according to the fifth embodiment of the invention. The present embodiment is arranged such that one end of a first laminated piezoelectric element 2 is fixedly supported by a base 7 through a retaining element 14, and a constriction 16 is formed in the retaining element 14. The constriction 16 is a constriction or a vena contracta which is provided in an oscillating or vibrating direction of the laminated piezoelectric elements 3 and 10. In this connection, the reference numeral 15 denotes a bolt for fixing the retaining element to the base 7.

According to the present embodiment, it is possible that bending rigidity of the entire piezoelectric transducer is reduced to increase bending amplitude, by the constriction 16 of the retaining element 14. Bending stress is concentrically applied to the constriction. Thus, it is possible to reduce the bending stress applied to the laminated piezoelectric element 2, and to increase the reliability of the ultrasonic piezoelectric transducer. Moreover, the constriction 16 also has an advantage so as to insulate or isolate the vibration of the ultrasonic piezoelectric transducer from being transmitted to the base 7.

[SIXTH EMBODIMENT]

Figure 7:
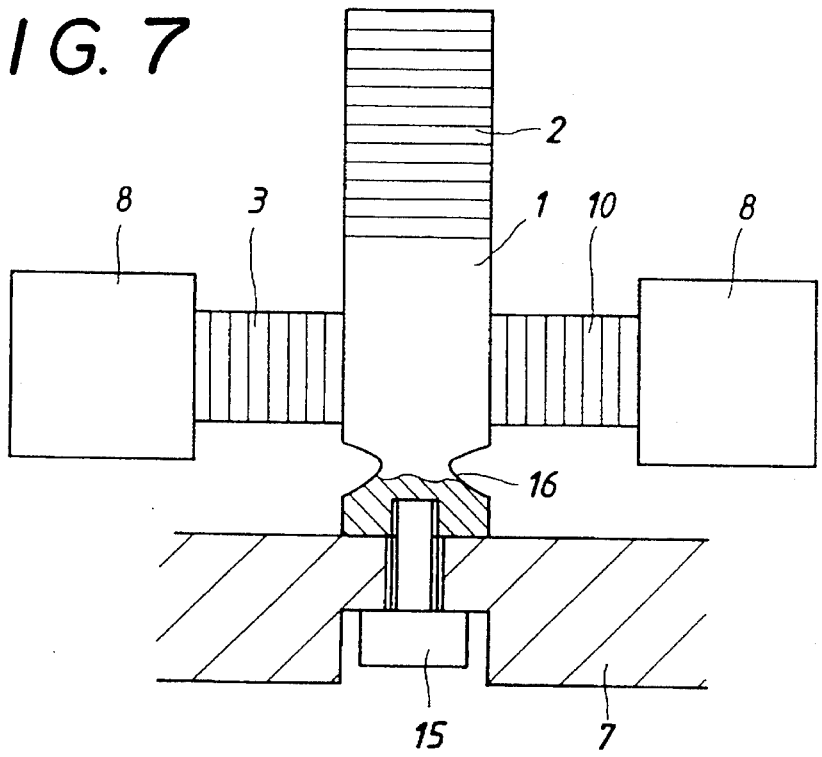
FIG. 7 is a partially broken-away front elevational view showing an ultrasonic piezoelectric transducer according sixth embodiment of the invention.

Next, a sixth embodiment of the invention will be described. FIG. 7 is a front elevational view showing, partially broken away, an ultrasonic piezoelectric transducer according to the sixth embodiment of the invention. The present embodiment is arranged such that a resonator 1 and a first laminated piezoelectric element 2 are reversed vertically. According to the present embodiment, it is possible to reduce the required stress to be applied to the laminated piezoelectric element 2, such that it is less than that of the aforementioned fifth embodiment.

[SEVENTH EMBODIMENT]

Figure 8:
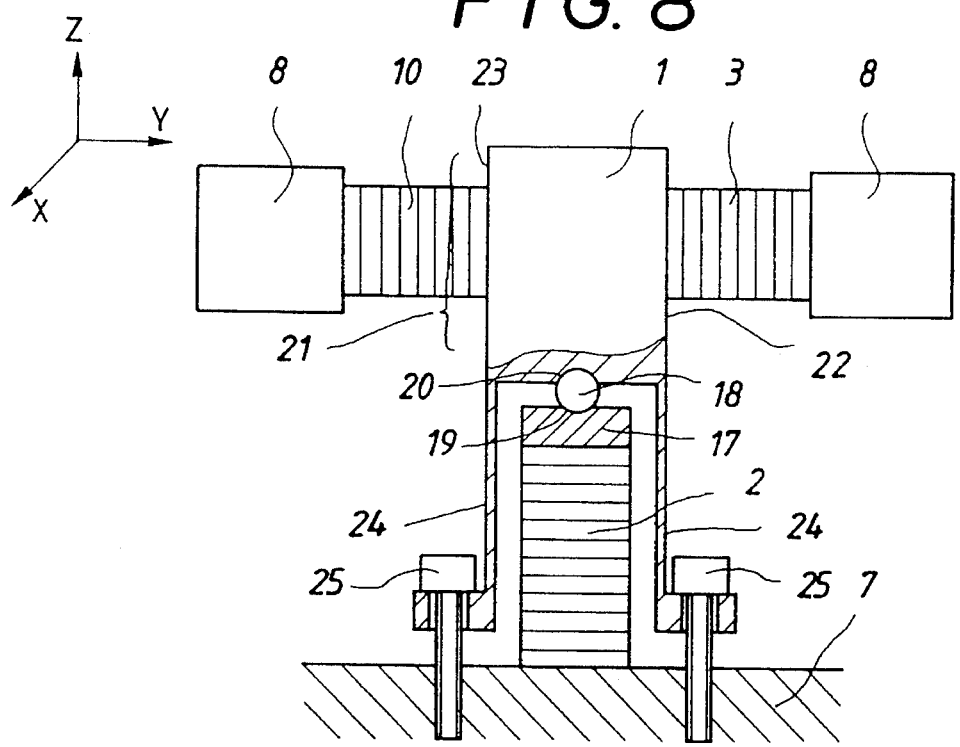
FIG. 8 is a partially broken-away front elevational view showing an ultrasonic piezoelectric transducer according to a seventh embodiment of the invention.

Next, a seventh embodiment of the invention will be described. FIG. 8 is a front elevational view showing, partially broken away, an ultrasonic piezoelectric transducer according to the seventh embodiment of the invention. As shown in FIG. 8, the present embodiment is arranged such that a receiving seat 17 is adhered to and fixedly mounted on an upper surface of a laminated piezoelectric element 2. A concave surface 19 is formed such that a quenched or hardened stainless steel ball 18 is placed on a central portion of the receiving seat 17 without rattle or backlash. A similar concave surface 20 is also formed in on a lower surface of a resonator 1. Furthermore, legs 24 each in the form of a thin plate are provided in extension on a body 21 of the resonator 1 on which a pair of laminated piezoelectric elements 3 and 10 are mounted, with the legs 24 facing downwardly from side surfaces 22 and 23. Lower ends of the respective legs 24 are tightened to a base 7 by bolts 25. By doing so, an urging force in a compressive direction is applied to the laminated piezoelectric element 2.

In the present embodiment, vibration in a Y-direction becomes oscillating vibration with the ball 18 serving as a fulcrum, differentiated from the bending vibration described previously. Accordingly, a bending stress does not at all act upon the laminated piezoelectric element 2. Further, since a force in the compressive direction is always urged upon the laminated piezoelectric element 2, it is possible to increase or raise reliability of the ultrasonic piezoelectric transducer.

[EIGHTH EMBODIMENT]

Figure 9:
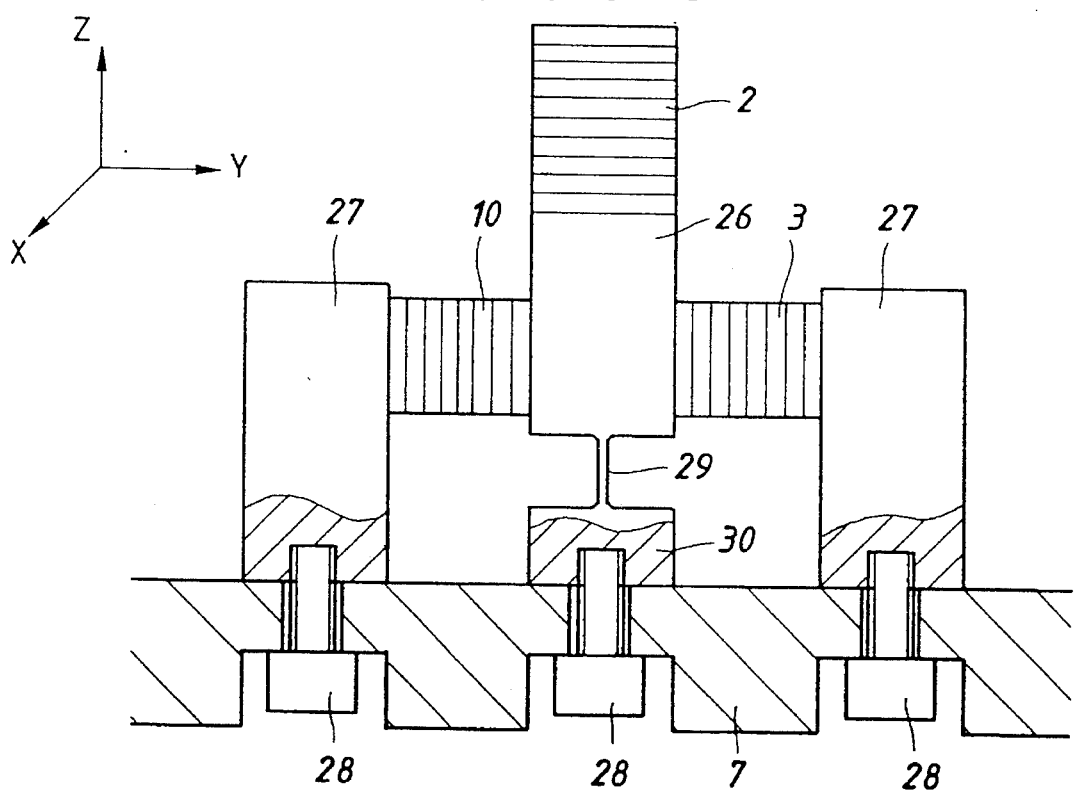
FIG. 9 is a partially broken-away front elevational view showing an ultrasonic piezoelectric transducer according to an eighth embodiment of the invention.

Next, an eighth embodiment of the invention will be described. FIG. 9 is a front elevational view showing, partially broken away, an ultrasonic piezoelectric transducer according to the eighth embodiment of the invention. The present embodiment is arranged such that the other ends of the respective second laminated piezoelectric elements 3 and 10 fixedly mounted on left- and right-hand side surfaces of a resonator 26 are fixed by retaining elements 27. The retaining elements 27 are fixedly mounted on a base 7 by bolts 28. Moreover, a resilient or elastic support section 29 in the form of a plate is formed on the resonator 26. The resonator 26 is so supported as to be capable of tilting only in a Y-direction, and is so supported as not to be displaced in X- and Z-directions.

In the present embodiment, since the other ends of the respective second laminated piezoelectric elements 3 and 10 are so fixed as not to be displaced, the present embodiment has an advantage similar or equivalent to that of an arrangement in which an additional mass which is infinite in mass is mounted, because, in a case where a mass is infinite, a contact surface between the laminated piezoelectric elements and the mass is not moved. This is because this is equal to a condition in which the retaining element 27 is fixedly mounted on the base 7. Thus, it is possible to strengthen a vibrating force in the Y-direction. Furthermore, since the elastic support section 29 in the form of a plate is mounted on the resonator 26, it is possible to insulate and isolate the amount of vibration of the resonator 26 transmitted to the base 7. Thus, it is possible to provide an ultrasonic piezoelectric transducer which is superior in efficiency.

[NINTH EMBODIMENT]

Next, a ninth embodiment of the invention will be described. FIG. 10 is a front elevational view, partially broken away, of an ultrasonic piezoelectric transducer according to the ninth embodiment of the invention. As shown in FIG. 10, in the present embodiment, a resonator 1, laminated piezoelectric elements 3 and 10, and additional masses 8 are tightened by bolts 31 passing therethrough. Through holes or bores 32 in the laminated piezoelectric elements 3 and 10 are formed larger than an outer diameter of each of the bolts 31. Upon tightening, the laminated piezoelectric elements 3 and 10 and the bolts 31 are not in contact with each other in order to prevent the vibration from being attenuated or damped.

In the present embodiment, elastic deformation in a tensile direction due to a tightening force occurs in the bolts 31 so that a reaction force thereof acts as a compressive force to the laminated piezoelectric elements 3 and 10. Accordingly, a tensile stress due to bending resonant vibration does not act upon the laminated piezoelectric elements 3 and 10. Thus, breakage or destruction of the piezoelectric element is prevented from occurring and it is possible to increase or raise reliability of the ultrasonic piezoelectric element.

Figure 11:
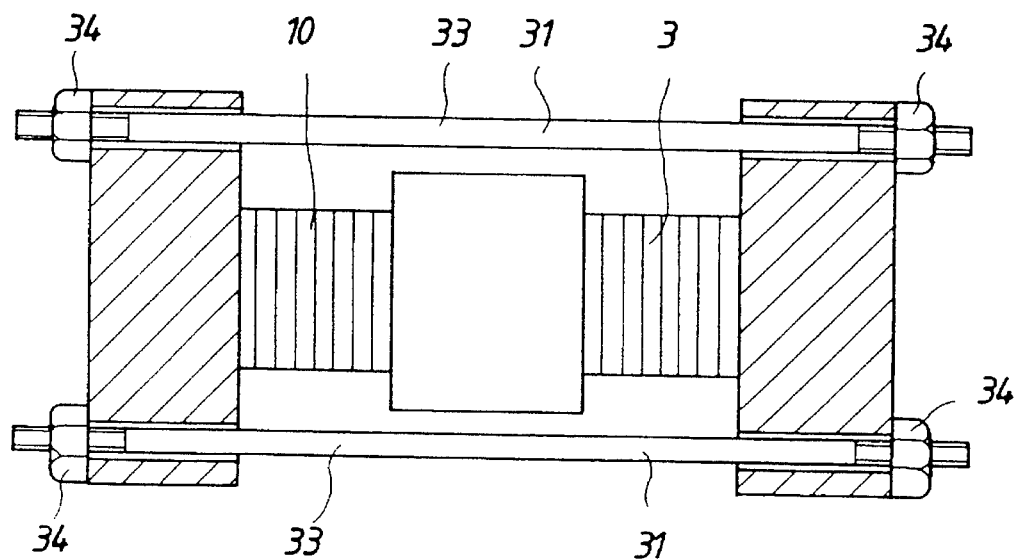
FIGS. 11(a) and 11(b) are a top plan view and a front elevational view showing a modification of the ultrasonic piezoelectric transducer according to the ninth embodiment of the invention.
Figure 11:
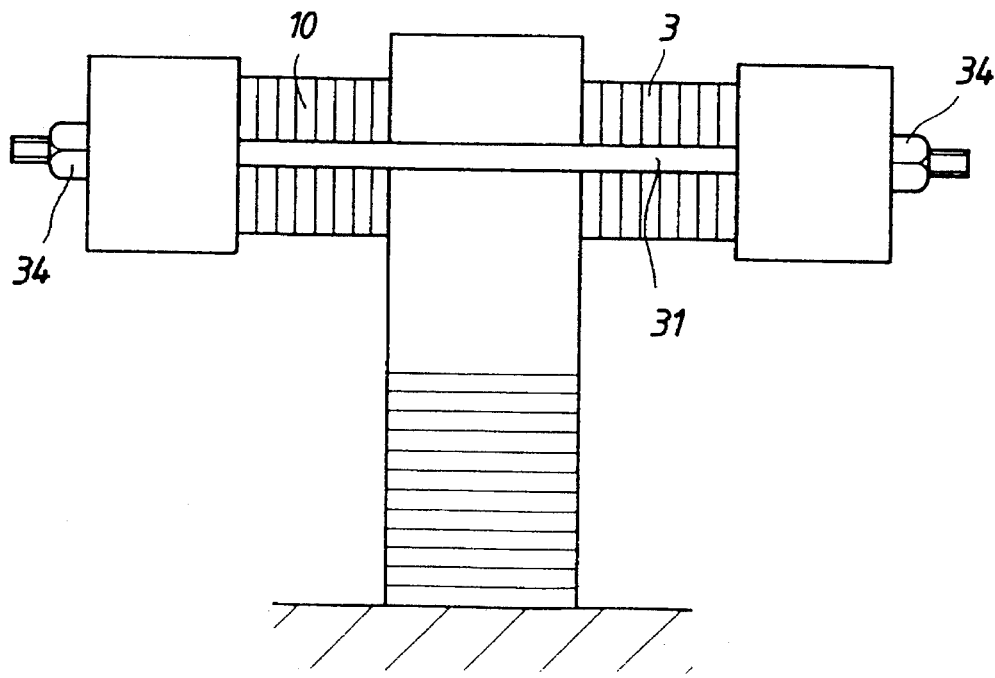

In connection with the above, the present embodiment may be carried into practice as shown in FIGS. 11(a) and 11(b) or FIG. 12. In FIGS. 11(a) and 11(b), tightening is performed by two sets of bolts 33 and nuts 34. In this case, it is not necessary to form a hole or bore in the laminated piezoelectric elements 3 and 10. Thus, since it is possible to secure a large thickness longitudinal vibration area of the element, an output from the ultrasonic piezoelectric transducer increases. Further, in FIG. 12, tightening elements 35 and additional masses 36 capable of being elastically deformed are formed integrally with each other. In the present embodiment, the additional masses 36 are pressed from both sides with the resonator 1 and the laminated piezoelectric elements 3 and 10 put therebetween, and two tightening elements are integrally fixed to each other by laser welding. The present embodiment is simple in configuration, and can simplify manufacturing steps. Moreover, since the ultrasonic piezoelectric transducer is strongly fixed by the laser, it is possible to improve reliability of the ultrasonic piezoelectric transducer.

[TENTH EMBODIMENT]

Figure 13:
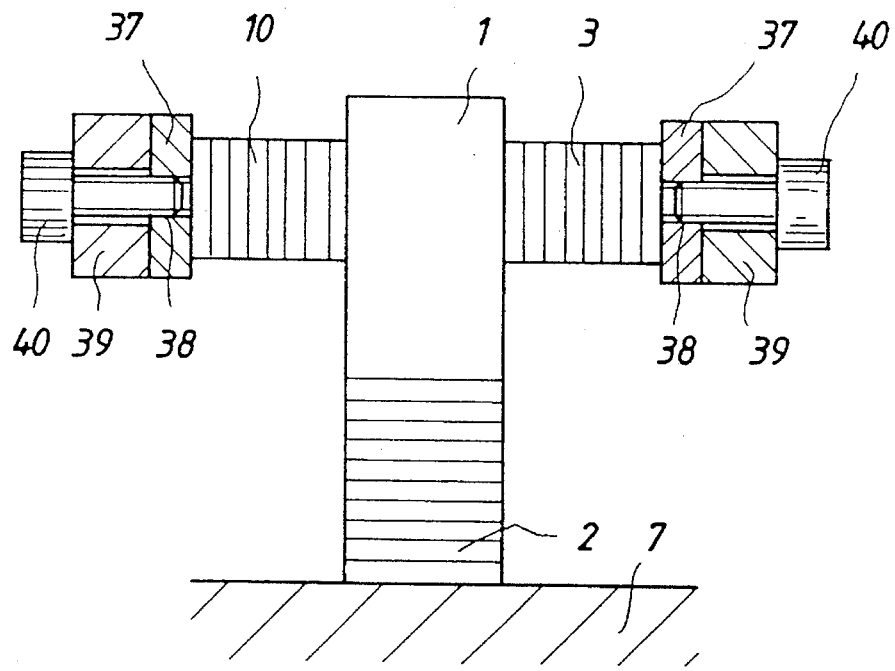
FIG. 13 is a partially broken-away front elevational view showing an ultrasonic piezoelectric transducer according to a tenth embodiment of the invention.

A tenth embodiment of the invention will next be described. FIG. 13 is a front elevational view showing, partially broken away, an ultrasonic piezoelectric transducer according to the tenth embodiment of the invention. As shown in FIG. 13, in the present embodiment, additional masses 39 are detachably mounted respectively through additional-mass retaining plates 37. The reference numeral 38 denotes screw bores formed respectively in the additional masses 37; and reference numeral 40 denotes bolts for mounting the masses 39.

In the present embodiment, since the additional masses 39 are detachable, it is possible to selectively regulate the resonant frequency of the bending vibration due to the left- and right-hand laminated piezoelectric elements 3 and 10. Accordingly, it is possible to take regulation with respect to an electric circuit for resonant driving.

[ELEVENTH EMBODIMENT]

Figure 14:
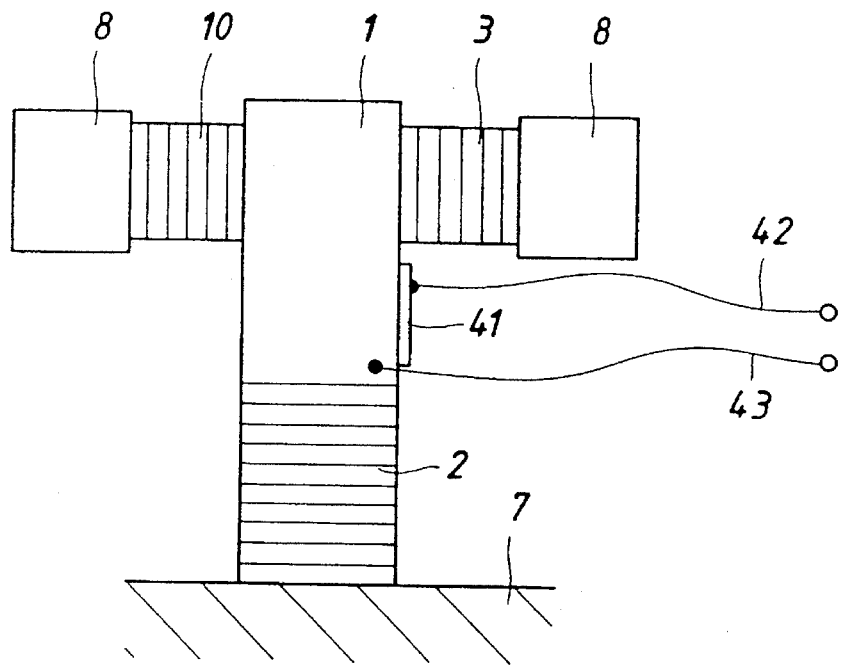
FIG. 14 is a front elevational view showing an ultrasonic piezoelectric transducer according to an eleventh embodiment of the invention.

An eleventh embodiment of the invention will next be described. FIG. 14 Is a front elevational view showing an ultrasonic piezoelectric transducer according to the eleventh embodiment of the invention. As shown in FIG. 14, in the present embodiment, a piezoelectric element 41 for detecting vibration is adhered to and fixedly mounted on one of the surfaces upon which respective laminated piezoelectric elements 3 and 10 are mounted to a resonator 1. A detecting terminal 42 is connected to an upper surface of the piezoelectric element 41, while a ground terminal 43 is connected to the resonator 1.

In the present embodiment, frequency of bending resonant vibration is detected by the piezoelectric element 41, and feedback is applied to a drive circuit to perform tracking of the frequency, whereby it is possible to raise or increase driving efficiency to the maximum attainable value.

[TWELFTH EMBODIMENT]

A twelfth embodiment of the invention will next be described. FIG. 15 is a front elevational view showing an ultrasonic actuator according to the twelfth embodiment of the invention. As shown in FIG. 15, in this apparatus, chamfering is applied to a forward end 44 of a resonator 1, and an organic sliding element 45 is stuck or pasted thereto. The sliding element 45 is such that an inorganic material such as carbon fiber or the like is contained in a material having a polyimide matrix, for example. The sliding element 45 has a thickness thereof equal to or less than 0.5 mm, and preferably, an order of 0.1 mm. The sliding element 45 has a surface thereof in which polishing or abrasive finishing is performed to a value equal to or less than surface roughness of 3 μm. Here, the reference numeral 46 denotes an element to be driven which is so arranged as to be put or clamped between an ultrasonic piezoelectric transducer 9 and an urging mechanism 47. The urging mechanism 47 comprises pins 50 slidably inserted respectively into sliding bores 49 in a fixing element 48 without rattle, a plate 51 fixedly mounted on lower ends of the respective pins 50, and rotatable rollers 52 mounted on the plate 51. Thus, an urging force is regulated by an urging screw 54 threaded into a screw or threaded bore in the fixing element 48 and a spring 55. The element to be driven 46 is supported movably in a Y-direction by guide rollers 56 which are rotatably mounted respectively on fixing portions 57.

In the present embodiment, the sliding element 45 at the forward end 44 of the ultrasonic piezoelectric transducer 9 performs elliptic motion to move the element to be driven 46 in the Y-direction. In this manner, it is possible to realize the ultrasonic actuator by a simple structure of the ultrasonic piezoelectric transducer according to the invention. Moreover, if the ultrasonic piezoelectric transducer is in urging contact with a circular object, it is also possible to form or arrange a rotary-type ultrasonic actuator.

[THIRTEENTH EMBODIMENT]

Figure 16:
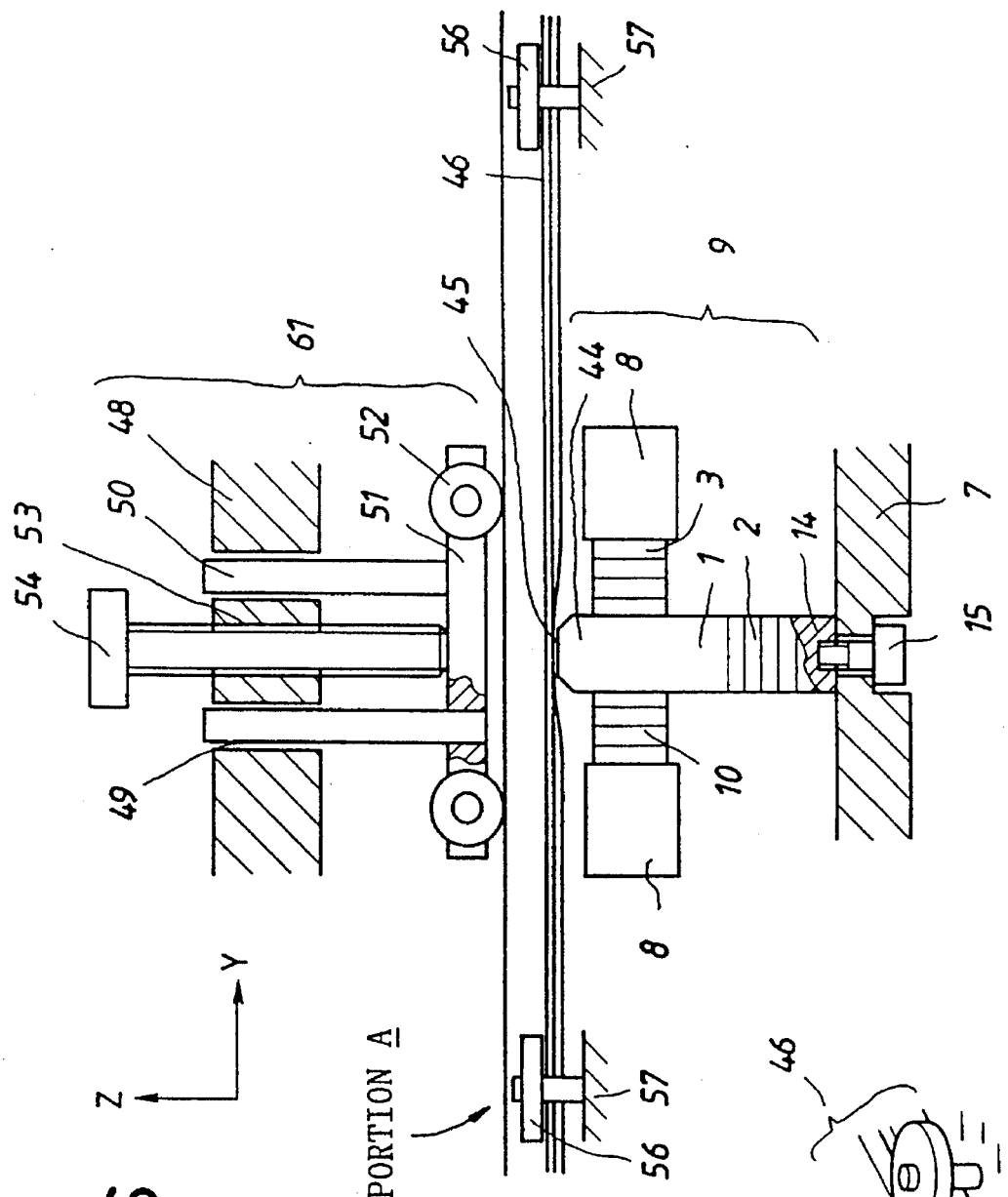
FIGS. 16 and 16A are front elevational views showing an ultrasonic actuator according to a thirteenth embodiment of the invention.
Figure 16A:
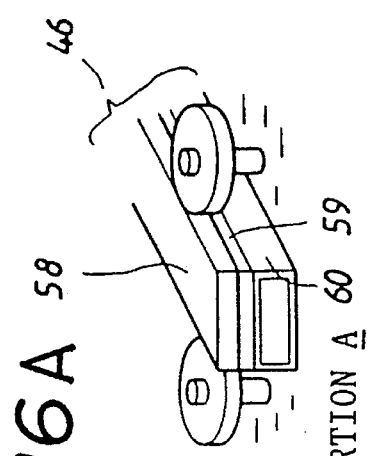
Figure 17:
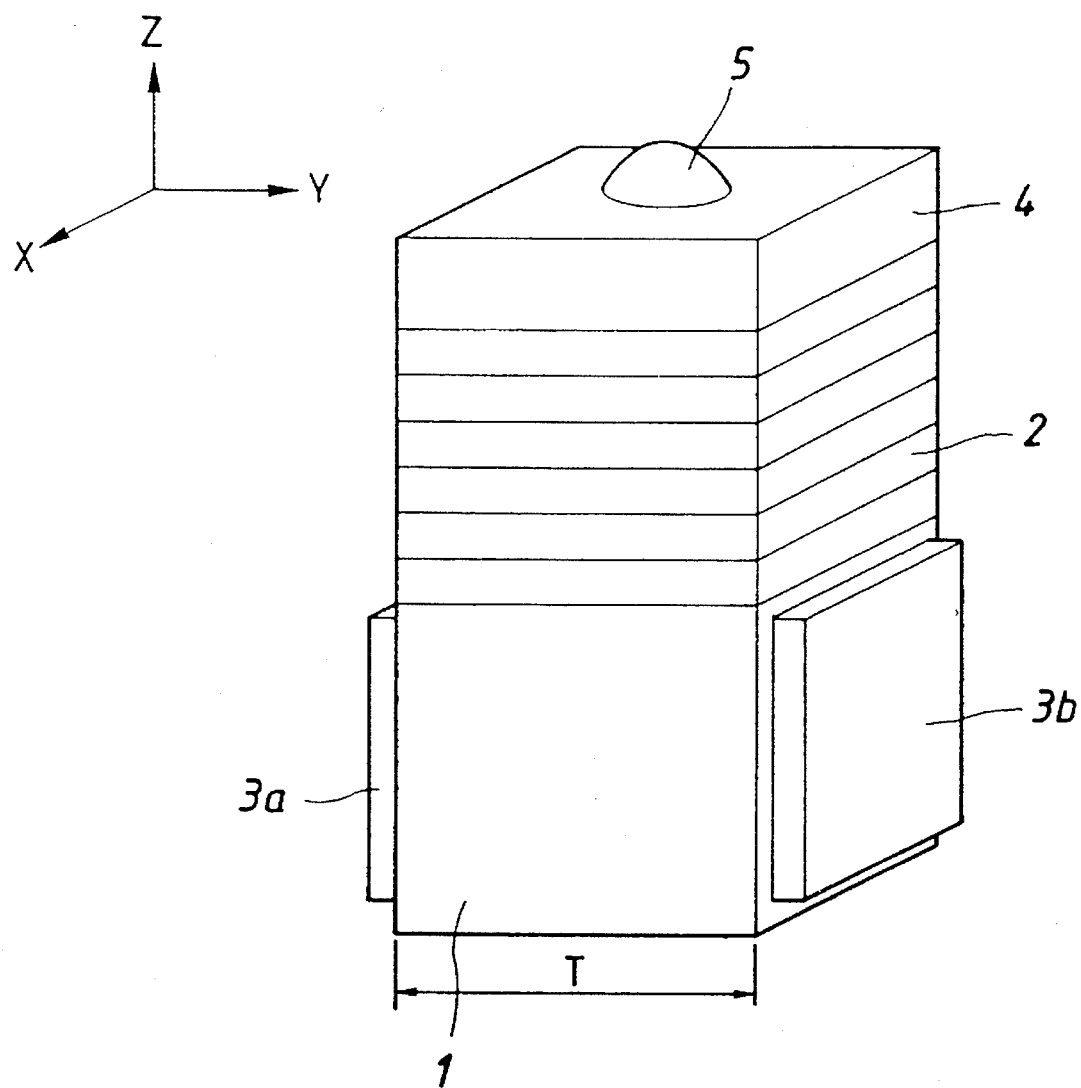
FIG. 17 is a perspective view showing a prior art or conventional ultrasonic piezoelectric transducer.

A thirteenth embodiment of the invention will next be described. FIG. 16 is a front elevational view showing an ultrasonic actuator according to the thirteenth embodiment of the invention. As shown in FIG. 16, in the present embodiment, a plate 51 is directly urged by an urging screw 54. On the other hand, an element to be driven 46 comprises a polished plate 58 made of stainless steel, and a resilient or elastic body 60 in which a thin plate made of stainless steel is formed into a square configuration. A vibration-isolating or vibration-proof urethane rubber 59 is mounted between the polishing plate 58 and the elastic body 60. In the present embodiment, since the elastic body 60 is integrally formed with the element to be driven 46, a structure of an urging mechanism 61 is made further easy and compact.

It is apparent that, in this invention, a wide range of different working modes can be formed bas on the invention without deviating from the spirit and scope of the invention. This invention is not restricted by its specific working modes except being limited by the appended claims.

What is claimed is:

1. An ultrasonic piezoelectric transducer comprising:
   a base;
   a first laminated piezoelectric element having first and second ends, the first end adhering to the base;
   a resonator having an end adhering to the second end of the first laminated piezoelectric element;
   a second laminated piezoelectric element having first and second ends, the first end of the second laminated piezoelectric element adhering to the resonator in a direction other than a vibrating direction of the first laminated piezoelectric element; and
   a load mass having an end adhering to the second end of the second laminated piezoelectric element, the load mass arranged to contact only the second laminated piezoelectric element.

2. An ultrasonic motor comprising:
   an ultrasonic piezoelectric transducer including:
   a base;
   a first laminated piezoelectric element having first and second ends, the first end being connected to the base;
   a resonator having first and second ends, the first end being connected to the second end of the first laminated piezoelectric element;
   a pair of second laminated piezoelectric elements each having first and second ends, the first end of each of the second laminated piezoelectric elements being connected to the resonator in a direction other than a vibrating direction of the first laminated piezoelectric element such that the second laminated piezoelectric elements are laterally symmetrically mounted to the resonator; and
   a plurality of load masses each having an end connected to the second end of one of the second laminated piezoelectric elements, each load mass contacting only a respective one of the second laminated piezoelectric elements;

a sliding element connected to the second end of the resonator;

a movable member urged against a surface of the sliding element; and an urging mechanism arranged to urge the movable member against the resonator.

3. An ultrasonic piezoelectric transducer comprising:

a base;

a first laminated piezoelectric element having first and second ends, the first end adhering to the base;

a resonator having an end adhering to the second end of the first laminated piezoelectric element;

a pair of second laminated piezoelectric elements each having first and second ends, the first end of each of the second laminated piezoelectric elements adhering to the resonator in a direction other than a vibrating direction of the first laminated piezoelectric element such that the second laminated piezoelectric elements are laterally symmetrically mounted to the resonator; and a plurality of load masses each having an end adhering to the second end of one of the second laminated piezoelectric elements, each of the load masses being arranged to contact only a respective second laminated piezoelectric element.

4. An ultrasonic piezoelectric transducer comprising:

a base;

a first laminated piezoelectric element having first and second ends, the first end adhering to the base;

a resonator having an end adhering to the second end or the first laminated piezoelectric element;

a pair of second laminated piezoelectric elements each having first and second ends, the first end of each of the second laminated piezoelectric elements adhering to the resonator in a direction other than a vibrating direction of the first laminated piezoelectric element such that the second laminated piezoelectric elements are laterally symmetrically mounted to the resonator; and a plurality of load masses each having an end adhering to the second end of one of the second laminated piezoelectric elements, each of the load masses being arranged to contact only a respective second laminated piezoelectric element, wherein the resonator has a side surface provided with a plurality of horizontally extending grooves.

5. An ultrasonic piezoelectric transducer comprising:

a base;

a first laminated piezoelectric element having first and second ends, the first end adhering to the base;

a resonator having an end adhering to the second end of the first laminated piezoelectric element;

a plurality of second laminated piezoelectric elements each having first and second ends, the first end of each second laminated piezoelectric element adhering to the resonator in a direction other than a vibrating direction of the first laminated piezoelectric element;

a plurality of additional-mass retaining plates each adhering to the second end of a respective second laminated piezoelectric element, each additional-mass retaining plate having a screw bore; and a plurality of load masses each detachably secured to an end of a respective additional-mass retaining plate by a bolt;

the second laminated piezoelectric elements, the additional-mass retaining plates, the bolts and the load masses being paired in bilateral symmetry with respect to the resonator;

the load masses contacting only the ultrasonic piezoelectric transducer.

6. An ultrasonic piezoelectric transducer comprising:

a base;

a first laminated piezoelectric element having first and second ends, the first end adhering to the base;

a square pole resonator having an end adhering to the second end of the first laminated piezoelectric element;

four second laminated piezoelectric elements each having first and second ends, the first end of each of the second laminated piezoelectric elements adhering to a respective side surface of the resonator in a direction other than a vibrating direction of the first laminated piezoelectric element; and a plurality of load masses each having an end adhering to the second end of one of the second laminated piezoelectric elements, each of the load masses being arranged to contact only a respective one of the second laminated piezoelectric elements.

7. An ultrasonic piezoelectric transducer comprising:

a base;

a resonator having first and second ends, the first end being secured to the base by a bolt;

a first laminated piezoelectric element having an end adhering to the second end of the resonator;

a second laminated piezoelectric element having first and second ends, the first end of the second laminated piezoelectric element adhering to the resonator in a direction other than a vertical vibrating direction of the first laminated piezoelectric element; and a load mass adhering to the second end of the second laminated piezoelectric element, the load mass contacting only the second laminated piezoelectric element.

8. An ultrasonic piezoelectric transducer comprising:

a base;

a resonator having first and second ends, the first end being secured to the base by a bolt, the resonator having an elastic portion arranged so that the resonator is movable in a horizontal direction relative to the base;

a first laminated piezoelectric element adhering to the second end of the resonator;

a pair of second laminated piezoelectric elements each having first and second ends, the first end of each of the second laminated piezoelectric elements adhering to a side of the resonator in the horizontal direction such that the second laminated piezoelectric elements are laterally symmetrically mounted to the resonator; and a retaining element adhering to the second end of each of the second laminated piezoelectric elements, the retaining element being secured to the base by a bolt.

9. An ultrasonic piezoelectric transducer comprising:

a base;

a first laminated piezoelectric element having first and second ends, the first end adhering to the base;

a resonator having an end adhering to the second end of the first laminated piezoelectric element;

a pair of second laminated piezoelectric elements each adhering to the resonator and having a load mass connected thereto; and a fixing element arranged for pressing the pair of second laminated piezoelectric elements toward the resonator in a direction other than a vibrating direction of the first laminated piezoelectric element such that the second laminated piezoelectric elements and the load masses are laterally symmetrically mounted to the resonator, the resonator having a screw bore for securing the fixing element to the resonator, each second laminated piezoelectric element having a central bore extending therethrough, the fixing element being located in each central bore without contacting the second laminated piezoelectric elements, each of the load masses contacting only a respective one of the second laminated piezoelectric elements.

10. An ultrasonic piezoelectric transducer comprising:

a base;

a first laminated piezoelectric element having first and second ends, the first end adhering to the base;

a pair of second laminated piezoelectric elements each adhering to the resonator and having a load mass connected thereto; and a fixing element arranged for pressing the pair of second laminated piezoelectric elements against the resonator in a direction other than a vibrating direction of the first laminated piezoelectric element such that the second laminated piezoelectric elements and the load masses are laterally symmetrically mounted to the resonator, the fixing element securing the load masses in a mutually connected relationship without contacting the second laminated piezoelectric elements, each of the load masses contacting only a respective one of the second laminated piezoelectric elements.

11. An ultrasonic piezoelectric transducer comprising:

a base;

a first laminated piezoelectric element having first and second ends, the first end adhering to the base;

a resonator having an end adhering to the second end of the first laminated piezoelectric element;

a pair of second laminated piezoelectric elements each adhering to the resonator and having a load mass connected thereto;

each of the load masses contacting only a respective one of the second laminated piezoelectric elements; and a pulse detecting element connected to the resonator and arranged for detecting the vibration of the resonator 12. An ultrasonic motor comprising:

an ultrasonic piezoelectric transducer including:

a base;

a first laminated piezoelectric element having first and second ends, the first end adhering to the base;

a resonator having first and second ends, the first end adhering to the second end of the first laminated piezoelectric element;

a pair of second laminated piezoelectric elements each having first and second ends, the first end of each of the second laminated piezoelectric elements adhering to the resonator in a direction other than a vibrating direction of the first laminated piezoelectric element such that the second laminated piezoelectric elements are laterally symmetrically mounted to the resonator; and a plurality of load masses each having an end adhering to the second end of one of the second laminated piezoelectric elements, each load mass contacting only a respective one of the second laminated piezoelectric element;

a sliding element adhering to the second end of the resonator;

a movable member urged against the surface of the sliding element; and an urging mechanism adapted to urge the movable member against the resonator.

13. An ultrasonic piezoelectric transducer comprising:

a base;

a first laminated piezoelectric element having first and second ends, the first end being connected to the base;

a resonator having an end connected to the second end of the first laminated piezoelectric element;

a second laminated piezoelectric element having first and second ends, the first end of the second laminated piezoelectric element being connected to the resonator in a direction other than a vibrating direction of the first laminated piezoelectric element; and a load mass having an end connected to the second end of the second laminated piezoelectric element, the load mass arranged to contact only the second laminated piezoelectric element.

14. The ultrasonic piezoelectric transducer according to claim 13, wherein the resonator has a side surface provided with a plurality of horizontally extending grooves.

15. The ultrasonic piezoelectric transducer according to claim 13, wherein the load mass is arranged to be detachable with respect to the second laminated piezoelectric element.

16. An ultrasonic piezoelectric transducer comprising:

a base;

a first laminated piezoelectric element having first and second ends, the first end being connected to the base;

a resonator having an end connected to the second end of the first laminated piezoelectric element;

a pair of second laminated piezoelectric elements each having first and second ends, the first end of each of the second laminated piezoelectric elements being connected to the resonator in a direction other than a vibrating direction of the first laminated piezoelectric element such that the second laminated piezoelectric elements are laterally symmetrically mounted to the resonator; and a plurality of load masses each having an end connected to the second end of one of the second laminated piezoelectric elements, each of the load masses being arranged to contact only a respective second laminated piezoelectric element.

17. The ultrasonic piezoelectric transducer according to claim 16, wherein the resonator has a side surface provided with a plurality of horizontally extending grooves.

18. The ultrasonic piezoelectric transducer according to claim 16, wherein each load mass is arranged to be detachable with respect to the respective second laminated piezoelectric element.

19. An ultrasonic piezoelectric transducer comprising:

a base;

a first laminated piezoelectric element having first and second ends, the first end being connected to the base;

a square pole resonator having an end connected to the second end of the first laminated piezoelectric element;

four second laminated piezoelectric elements each having first and second ends, the first end of each of the second laminated piezoelectric elements being connected to a respective side surface of the resonator in a direction other than a vibrating direction of the first laminated piezoelectric element; and a plurality of load masses each having an end connected to the second end of one of the second laminated piezoelectric elements, each of the load masses being arranged to contact only a respective one of the second laminated piezoelectric elements.

20. The ultrasonic piezoelectric transducer according to claim 19, wherein the resonator has a side surface, a front surface and a rear surface each provided with a plurality of horizontally extending grooves.

21. The ultrasonic piezoelectric transducer according to claim 19, wherein each load mass is arranged to be detachable with respect to the respective second laminated piezoelectric element.

22. An ultrasonic piezoelectric transducer comprising:

a base;

a resonator having first and second ends, the first end being secured to the base;

a first laminated piezoelectric element having an end connected to the second end of the resonator;

a second laminated piezoelectric element having first and second ends, the first end of the second laminated piezoelectric element being connected to the resonator in a direction other than a vertical vibrating direction of the first laminated piezoelectric element; and a load mass connected to the second end of the second laminated piezoelectric element, the load mass contacting only the second laminated piezoelectric element.

23. An ultrasonic piezoelectric transducer comprising:

a base;

a resonator having first and second ends, the first end being secured to the base, the resonator having an elastic portion arranged so that the resonator is movable in a horizontal direction relative to the base;

a first laminated piezoelectric element connected to the second end of the resonator;

a pair of second laminated piezoelectric elements each having first and second ends, the first end of each of the second laminated piezoelectric elements being connected to a side of the resonator in the horizontal direction such that the second laminated piezoelectric elements are laterally symmetrically mounted to the resonator; and a retaining element connected to the second end of each of the second laminated piezoelectric elements, the retaining element being secured to the base.

24. An ultrasonic piezoelectric transducer comprising:

a base;

a first laminated piezoelectric element having first and second ends, the first end being connected to the base;

a resonator having an end connected to the second end of the first laminated piezoelectric element; and a pair of second laminated piezoelectric elements each being connected to the resonator and having a mass connected thereto;

a fixing element arranged for pressing the pair of second laminated piezoelectric elements toward the resonator in a direction other than a vibrating direction of the first laminated piezoelectric element such that the second laminated piezoelectric elements and the load masses are laterally symmetrically mounted to the resonator, the resonator having a screw bore for securing the fixing element to the resonator, each second laminated piezoelectric element having a central bore extending therethrough, the fixing element being located in each central bore, each of the load masses contacting only a respective one of the second laminated piezoelectric elements.

25. An ultrasonic piezoelectric transducer comprising:

a base;

a first laminated piezoelectric element having first and second ends, the first end being connected to the base;

a resonator having an end connected to the second end of the first laminated piezoelectric element; and a pair of second laminated piezoelectric elements each being connected to the resonator and having a load mass connected thereto;

a fixing element arranged for pressing the pair of second laminated piezoelectric elements against the resonator in a direction other than a vibrating direction of the first laminated piezoelectric element such that the second laminated piezoelectric elements and the load masses are laterally symmetrically mounted to the resonator, the fixing element securing the load masses in a mutually connected relationship without contacting the second laminated piezoelectric elements, each of the load masses contacting only a respective one of the second laminated piezoelectric elements.

26. An ultrasonic piezoelectric transducer comprising:

a base;

a first laminated piezoelectric element having first and second ends, the first end being connected to the base;

a resonator having an end connected to the second end of the first laminated piezoelectric element;

a pair of second laminated piezoelectric elements each being connected to the resonator and having a load mass connected thereto;

a bolt arranged for pressing the pair of second laminated piezoelectric elements toward the resonator in a direction other than a vibrating direction of the first laminated piezoelectric element such that the second laminated piezoelectric elements and the load masses are laterally symmetrically mounted to the resonator, the resonator having a screw bore for securing the bolt, each second laminated piezoelectric element having a central bore extending therethrough, the bolt being located in each central bore without contacting the second laminated piezoelectric elements, each of the load masses contacting only a respective one of the second laminated piezoelectric elements; and a pulse detecting element connected to the resonator and arranged for detecting the vibration of the resonator.

* * * * *